United States Patent [19]
Schweitzer, Jr.

[11] Patent Number: 5,990,674
[45] Date of Patent: *Nov. 23, 1999

[54] CLAMPING MECHANISM FOR MOUNTING CIRCUIT CONDITION MONITORING DEVICES ON CABLES OF VARIOUS DIAMETERS

[75] Inventor: Edmund O. Schweitzer, Jr., Northbrook, Ill.

[73] Assignee: E.O. Schweitzer Manfacturing Co., Inc., Mundelein, Ill.

[ * ] Notice: This patent is subject to a terminal disclaimer.

[21] Appl. No.: 08/940,069

[22] Filed: Sep. 29, 1997

Related U.S. Application Data

[63] Continuation-in-part of application No. 08/677,649, Jul. 8, 1996, Pat. No. 5,729,125.

[51] Int. Cl.$^6$ .......................... G01R 31/02; G01R 19/165
[52] U.S. Cl. .......................... 324/127; 324/133; 324/551; 336/176
[58] Field of Search ..................................... 324/127, 133, 324/541, 544, 551; 340/664; 336/176

[56] References Cited

U.S. PATENT DOCUMENTS

| 4,086,529 | 4/1978 | Schweitzer, Jr. | 324/127 |
|---|---|---|---|
| 4,456,873 | 6/1984 | Schweitzer, Jr. | 324/543 |
| 4,646,006 | 2/1987 | Schweitzer, Jr. | 324/127 |
| 4,873,706 | 10/1989 | Schweitzer, Jr. | 377/85 |
| 5,180,972 | 1/1993 | Schweitzer, Jr. | 324/127 |
| 5,483,215 | 1/1996 | Mies | 324/127 |
| 5,729,125 | 3/1998 | Schweitzer, Jr. | 324/127 |

*Primary Examiner*—Diep N. Do
*Attorney, Agent, or Firm*—Lockwood, Alex, Fitzgibbon & Cummings

[57] ABSTRACT

A clamping mechanism for mounting a circuit condition monitoring device to electrical cables of various diameters includes a core member comprising a plurality of laminations arranged in a generally rectangular configuration. A spring spanning the core member is anchored at one end to the core at a point near the housing of the monitoring device and at the other end is attached to a bridging member affixed at the opposite end of the core near the housing. This allows the spring to expand less as it transverses the bridge in order to accommodate different power cable diameters.

22 Claims, 5 Drawing Sheets

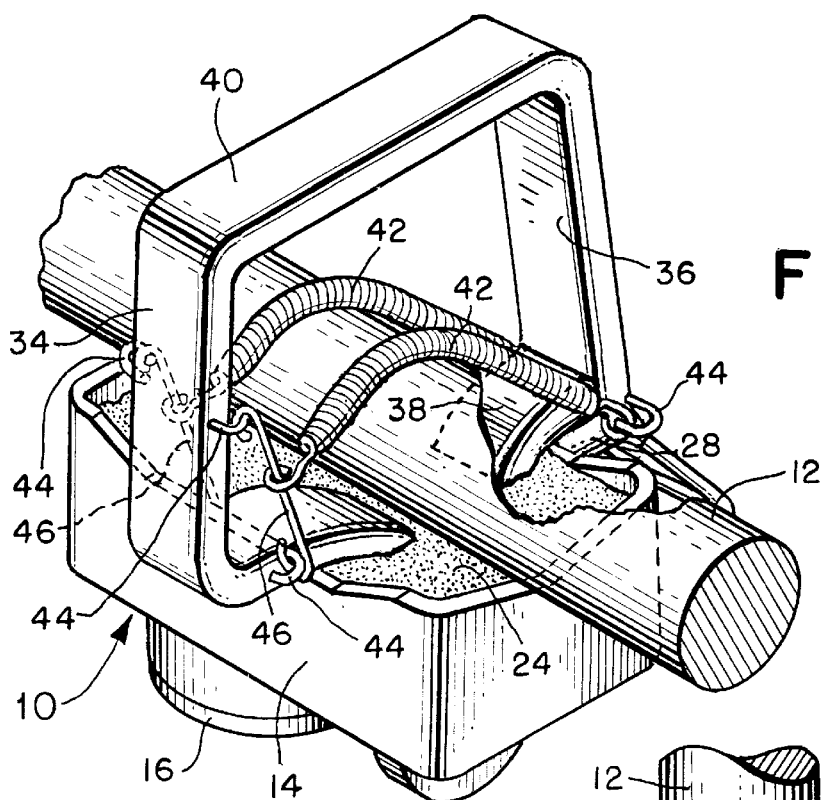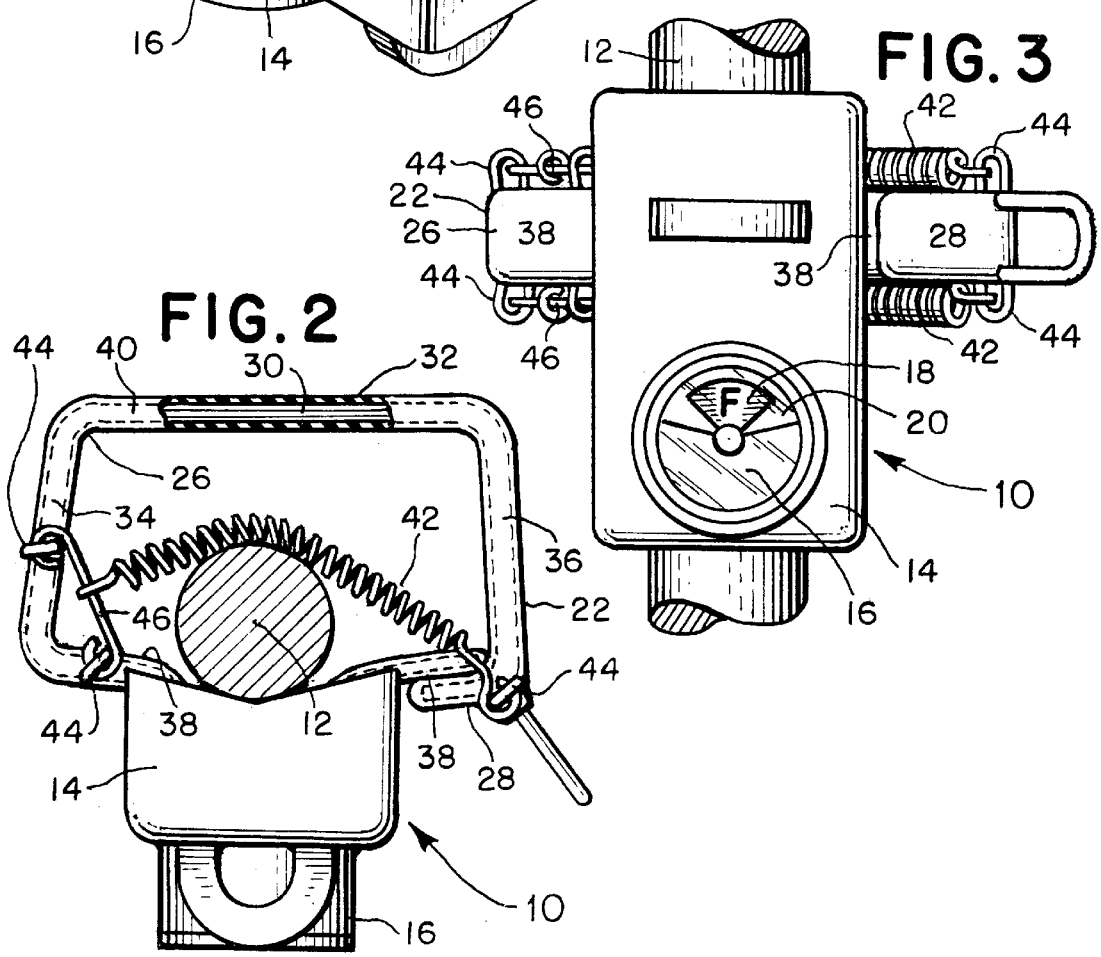

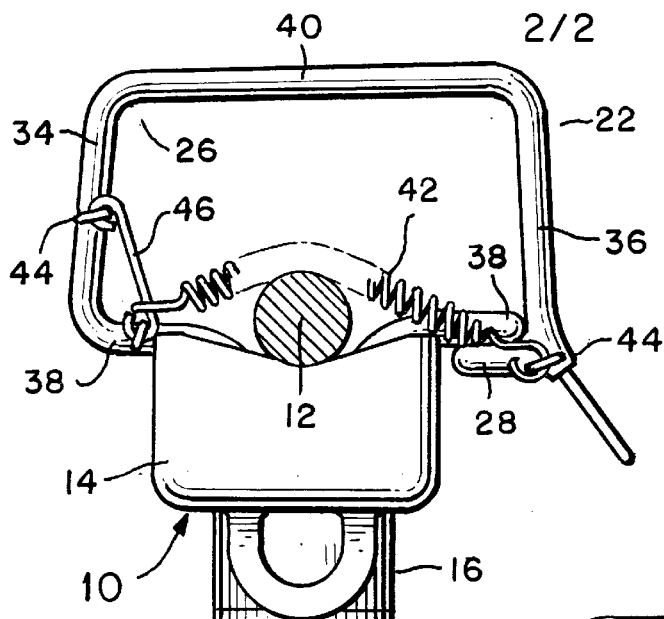
FIG. 4a
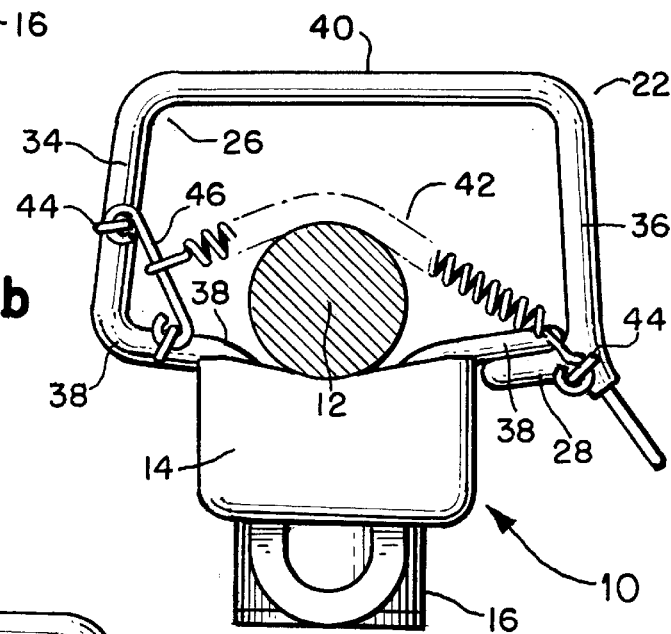
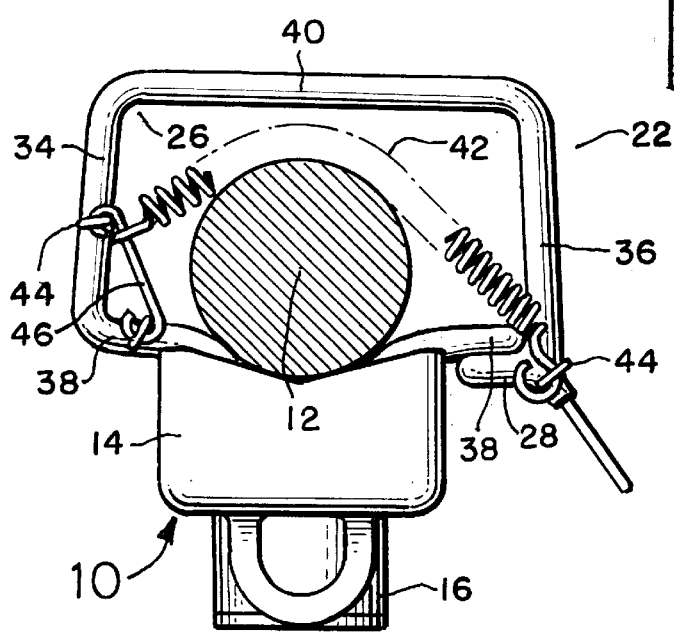
FIG. 4c

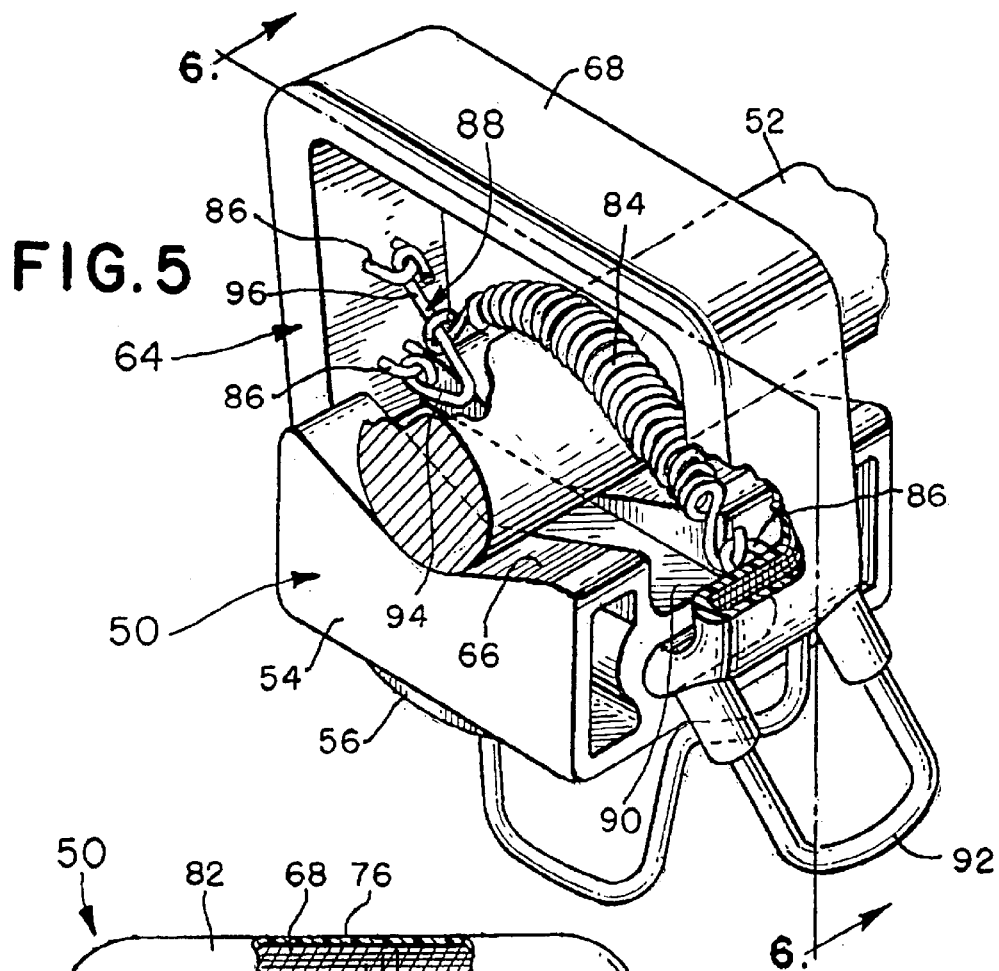
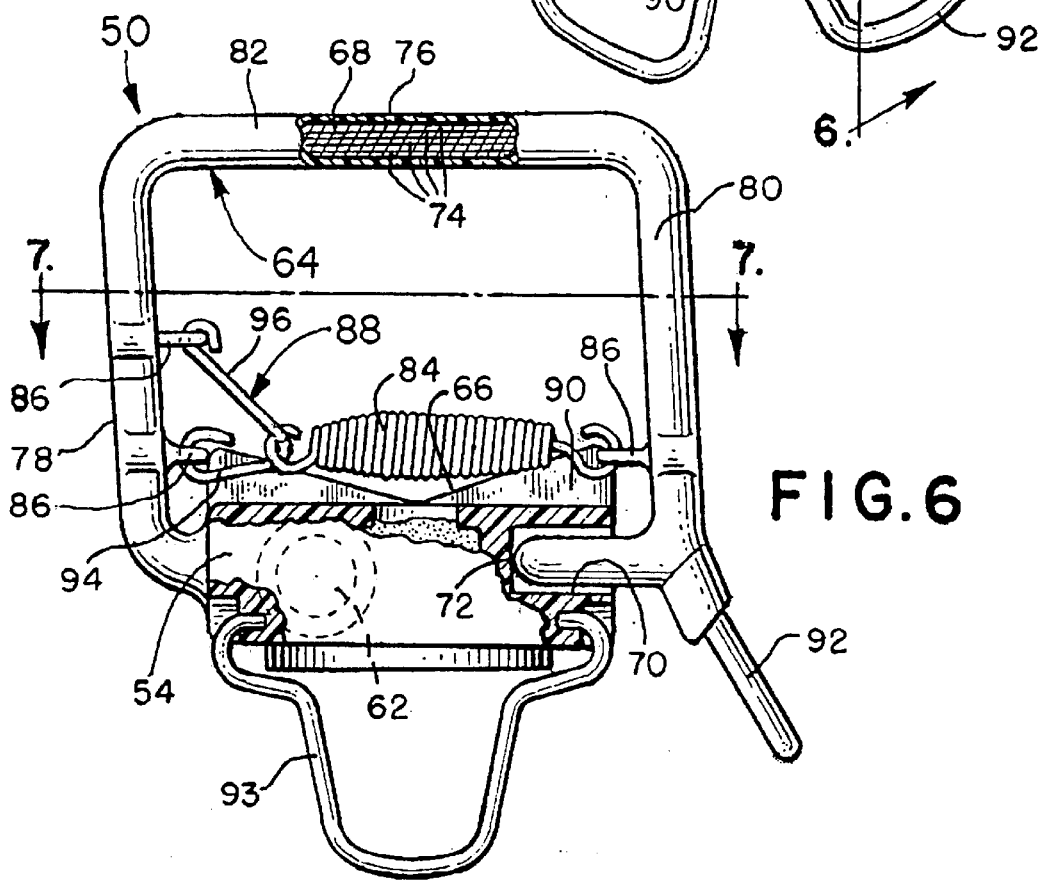

CLAMPING MECHANISM FOR MOUNTING CIRCUIT CONDITION MONITORING DEVICES ON CABLES OF VARIOUS DIAMETERS

This application is a continuation-in-part of U.S. application Ser. No. 08/677,649, filed Jul. 8, 1996, now U.S. Pat. No. 5,729,125.

BACKGROUND OF THE INVENTION

The present invention relates generally to circuit condition monitoring devices for use in electrical power distribution systems, and in particular to a clamp mechanism for clamping such devices to the various sized cables of such systems.

Electrical power distribution systems typically require the use of a variety of monitoring devices to facilitate the detection and location of system malfunctions. Among such devices are manual and automatic reset fault current indicators, and voltage monitoring devices. These devices are typically either mounted on a test point provided on a system component, or clamped directly onto a cable of the system.

Clamp-on mounting devices typically include a housing which contains the monitoring device, a circuit condition indicator, and some form of clamping mechanism for mounting the housing on a cable. Since power cables used in the industry are routinely of various diameters, it is necessary that the clamping mechanism accommodate a range of cable diameters.

In one prior clamp mechanism, which is described in U.S. Pat. No. 4,456,873 of the present inventor, a plurality of flexible metallic strips are combined to form a generally square-shaped core for use with a circuit condition monitoring device. One end of the core is fixedly positioned relative to the device housing, and the opposite end is detachably engaged to the one end. In use, the opposite end is displaced from the engagement, allowing the core to be passed around a cable.

Another prior clamp mechanism, which is described in U.S. Pat. No. 4,646,006, also of the present inventor, includes a pair of clamp members biased for engaging movement toward one another. A compression member between the clamp members ordinarily prevents engaging movement of the members. When pressed against a cable, the compression member deforms to allow the clamp members to move toward one another and encircle the cable and clamp a monitoring device thereon.

The present invention is directed to a clamp mechanism having a resilient core and a device housing having a cable engaging surface wherein a spring extends between the core portions on either side of the conductor to bias the conductor into engagement with the engaging surface. The spring is slidably attached at one end to a bridging element which allows the spring to slide and thereby extend less in accommodating cables of varying diameters. This enables the same clamp and spring to be used for a wide range of cable diameters.

Accordingly, it is a general object of the present invention to provide a new and improved clamp mechanism for a circuit monitoring device.

It is a more specific object of the present invention to provide a clamp mechanism for clamping a circuit condition monitoring device to the cable of a power distribution system wherein the cable has a range of diameters.

SUMMARY OF THE INVENTION

A clamping mechanism for mounting a circuit condition monitoring device on electrical cables having a predetermined range of diameters, comprising a housing for the monitoring device having a cable engaging surface, a core member extending from the housing and adapted to encircle a cable, the core member having a first portion generally on one side of the cable and a second portion generally on the other side of the cable, and a bridge member having one end attached to the first portion of the core at a first location, and its other end attached to the first portion of the core at a second location between the first location and said housing. Biasing means are attached at one end to the bridge member and attached at the other end to the second portion of the core for biasing the conductor into engagement with the cable engaging surface, the attachment to the bridging member comprising a sliding attachment allowing the one end of the biasing means to slide generally between the first location and the second location on the first portion of the core, the second portion of the core including a gap between the point of attachment of the spring means and the housing for passing the cable into the core between the biasing means and the cable engaging surface, and the one end of the biasing means sliding on the bridging member to accommodate the predetermined range of cable diameters.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a perspective view of a fault indicator incorporating a clamping mechanism constructed in accordance with the invention showing the mechanism clamped on a power cable.

FIG. 2 is a side-elevational view partially in section of the fault indicator of FIG. 1.

FIG. 3 is a front plan view of the fault indicator of FIGS. 1 and 2.

FIGS. 4a, 4b and 4c are side elevational views of the fault indicator of FIG. 3 illustrating the manner in which the clamping mechanism accommodates power cables of various diameters.

FIG. 5 is a perspective view of a fault indicator incorporating a clamping mechanism comprising an alternate embodiment of the invention.

FIG. 6 is a side-elevational view partially in section of the fault indicator of FIG. 5 prior to installation on a power cable.

DESCRIPTION OF THE PREFERRED EMBODIMENT

Figure 7:
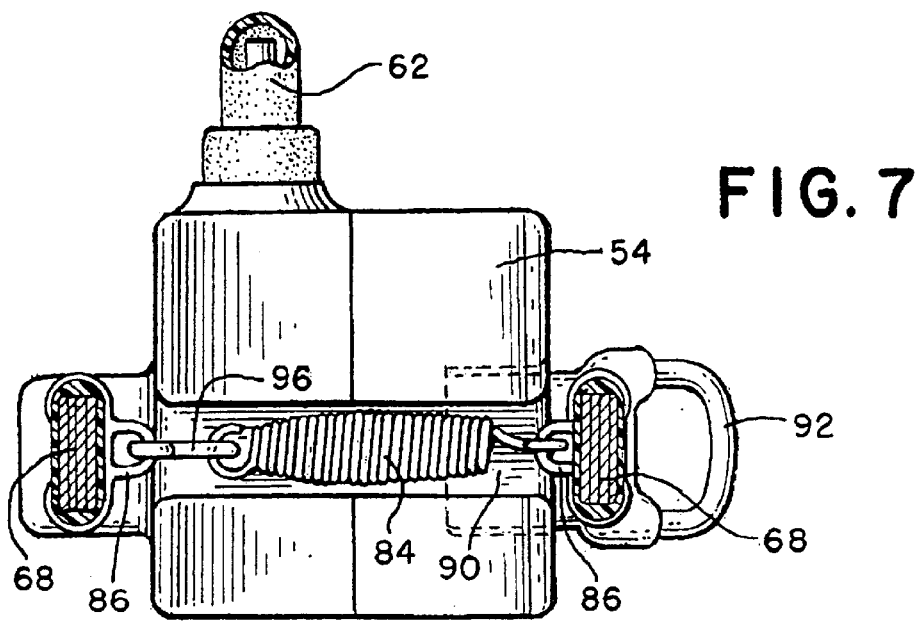
FIG. 7 is a cross-sectional view of the fault indicator of FIGS. 5 and 6 taken along line 7—7 of FIG. 6.
Figure 8:
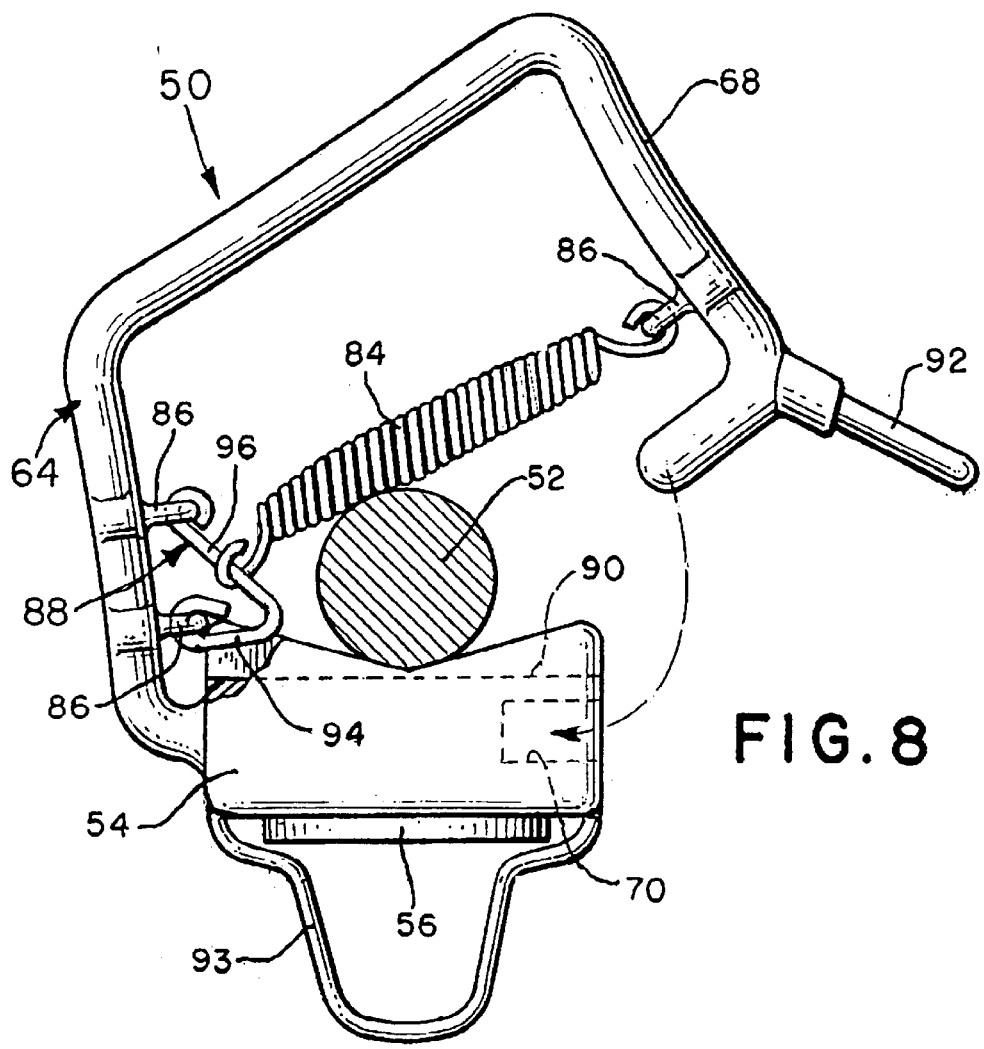
FIGS. 8 is a side-elevational view of the fault indicator of FIGS. 5–7 showing the clamping mechanism thereof being installed on a cable.

Referring to the Figures, and FIGS. 1–4 in particular, a circuit monitoring device, in this case a fault current indicator 10, is illustrated installed on an electrical cable 12 of an electrical power distribution system. Fault indicator 10 includes a rectangular housing 14 at the front face of which a cylindrical readout 16 displays the condition of the circuit with an internal indicator flag 18 visible through a window 20. Upon the occurrence of a fault, flag 18 rotates to the position shown to provide a visual indication that current in excess of a predetermined level has flowed in cable 12.

In order for the fault indicator 10 to accurately respond to the occurrence of fault current in cable 12, it is necessary that the device be firmly positioned adjacent the cable. To this end, the fault indicator is provided with a clamp mechanism 22 constructed in accordance with the invention. As best seen in FIG. 1, the clamp mechanism extends from the rear wall 24 of housing 14 opposite cylindrical readout 16 and fixes the device in close contact with the cable.

A core assembly 26 is utilized for attaching the housing 14 to a monitored conductor such as cable 12 and for deriving the necessary magnetic flux in sufficient concentration for powering the circuitry of the circuit module. The core assembly is preferably formed as a closed loop of generally rectangular configuration so as to completely encircle cable 12, and includes a pull ring 28 means by which the core can be opened to facilitate installation on or removal of the fault indicator from a monitored conductor.

The core assembly 26 is seen to consist of a plurality of individual strips or laminations 30 (FIG. 2) formed of oriented silicon steel arranged side-by-side in a generally rectangular closed-loop configuration. The core assembly is preferably encapsulated in a layer 32 of vinyl plastisol insulating material. As best seen in FIG. 2, the rectangular configuration includes a generally rectilinear first or left side portion 34, a generally rectilinear second or right side portion 36 opposed to first portion 34, a pair of generally rectilinear flanges and rear wall of housing as a third or bottom portion 38, and a generally rectilinear fourth or top portion 40 opposed to third portion 38. The closed loop consisting of side portions 34, 36, 38 and 40 includes a gap at the junction of the second or right side portion 36 and the third or bottom portion 38.

To maintain cable 12 in engagement with cable engaging surface 24 and gap closed, the core structure includes two helical springs 42. One end of each spring is secured to the second or right side portion 36 by a wire clip 44, which includes an eyelet portion for engaging the hooked end of the spring, and a stem portion which extends through the laminations 30. The other hooked end of springs 42 engages a bridge member 46 secured on one end to the bottom side portion 38 by a wire clip 44, and on the other end to the left side portion 34 by a wire clip 44, of the magnetic core assembly 26.

Because the spring members can be stretched along their linear axis, they will automatically adapt to encircle cables of differing diameters. In this regard, the ends of springs 42 transverse bridge member 46 as the cable size increases. Accordingly, the clamp mechanism automatically adjusts to the dimension of the particular cable encountered. This adaptation is best illustrated in FIGS. 4a–c where the position of the end of the spring 42 on bridge member 46 is seen to be dependent on the diameter of the cable.

The bridge member, which is inclined at a 45° angle relative to the cable engaging surface of the housing, enables the spring to retain its resilient properties as the diameter of the cable increases. If the spring was fixed at both ends, a large cable would tend to overstretch the spring and cause it to exceed its elastic modulus. Failure of the spring reduces the mechanical integrity of the clamp assembly.

Instead, with the accommodation of the invention, the bridge member provides a movable anchor at one end of the spring which enables that end of the spring to move as the diameter of the cables change. This allows the spring to extend less than would otherwise be the case.

In an alternate embodiment of the invention, depicted in FIGS. 5–10, the clamping mechanism of the present invention utilizes a single spring and a single bridging element. Referring to the figures, a circuit monitoring device, in this case a fault current indicator 50, is illustrated in its normal operating position on an electrical cable 52 of an electrical power distribution system. Fault indicator 50 includes a rectangular housing 54 at the front face of which a cylindrical portion 56 (FIG. 10) contains a readout of condition. An indicator flag 58 is visible through a window 60 provided in the cylindrical readout portion 56 of the housing. Upon the occurrence of a fault, indicator flag 58 rotates to a position to provide a visual indication that a fault current has occurred in cable 52. After such an event the fault indicator 50 may be manually reset by depressing a reset button 62.

In order for the fault indicator 50 to accurately respond to the occurrence of fault current in cable 52, it is necessary that the cable firmly engage the cable engaging surface of the fault indicator. To this end, the fault indicator is provided with a clamp mechanism 64 constructed in accordance with the invention. As best seen in FIG. 5, the clamp mechanism is attached to the cable engaging surface 66 of housing 54 opposite the cylindrical readout portion 56.

A core assembly 68 is preferably formed as a closed loop of generally rectangular configuration which completely encircles cable 52. The core includes a gap 72 within a recess 70 in housing 54 to enable the core to be opened to facilitate installation or removal of a monitored electrical conductor.

The core assembly 68 is seen to consist of a plurality of individual strips or laminations 74 (FIG. 6) formed of oriented silicon steel arranged side-by-side in a generally rectangular closed-loop configuration and is preferably encapsulated in a layer 76 of vinyl plastisol insulating material. The rectangular configuration includes a generally rectilinear first or left side portion 78, a generally rectilinear second or right side portion 80 opposed to first portion 78, and a generally rectilinear third or top portion 82 opposed to the cable engaging surface 66 of housing 54.

To maintain cable 62 engaged with cable engaging surface 66 and gap 72 closed clamp mechanism includes a helical spring 84. One end of this spring is secured to the second or right side portion 80 by a wire clip 86, which includes an eyelet portion for engaging the hooked end of the spring, and a stem portion which extends through the laminations 74. The other hooked end of spring 84 engages a bridge member 88 secured at its ends to the left side portion 78 by additional wire clips 86. When indicator 50 is not installed on a cable, the helical spring 84 rests within a channel 90 provided in the cable engaging surface 66 of housing 54.

Prior to installation on a conductor, clip mechanism 64 is shown in FIG. 6 with gap 72 closed. In order to mount the clamp mechanism on a cable, wire handles 92 and 93 may be provided to pull the end of the core away from recess 70. During installation of the fault indicator, cable 52 is passed through gap 72 (FIG. 8), and the wire handle 92 is once again used to insert the end of the core into recess 70 whereby gap 72 is closed and cable 52 is securely engaged to the cable engaging surface 66 of housing 54.

Figure 9A:
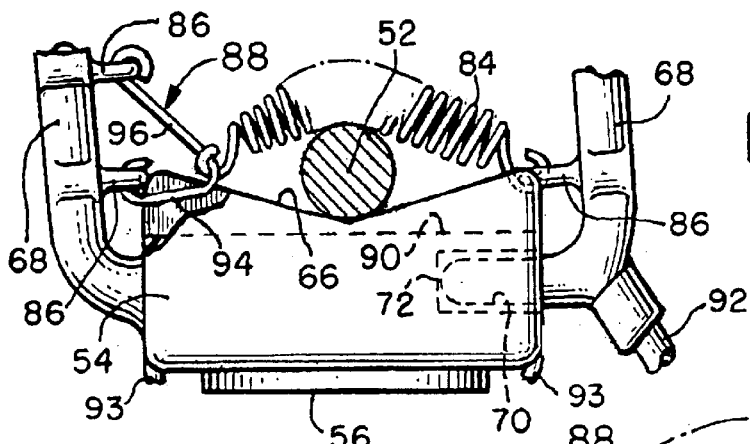
FIGS. 9a–9c are side-elevational views of the fault indicator of FIGS. 5–8 illustrating the manner in which the clamping mechanism of the invention fits onto power cables of various diameters.
Figure 9B:
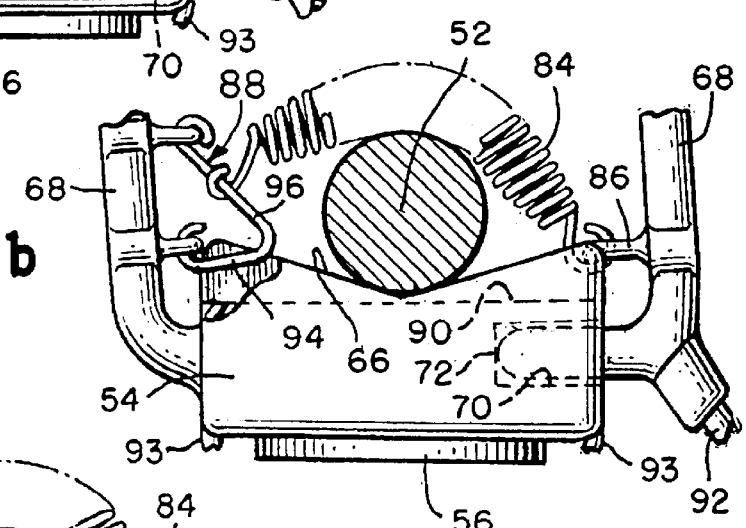
Figure 9C:
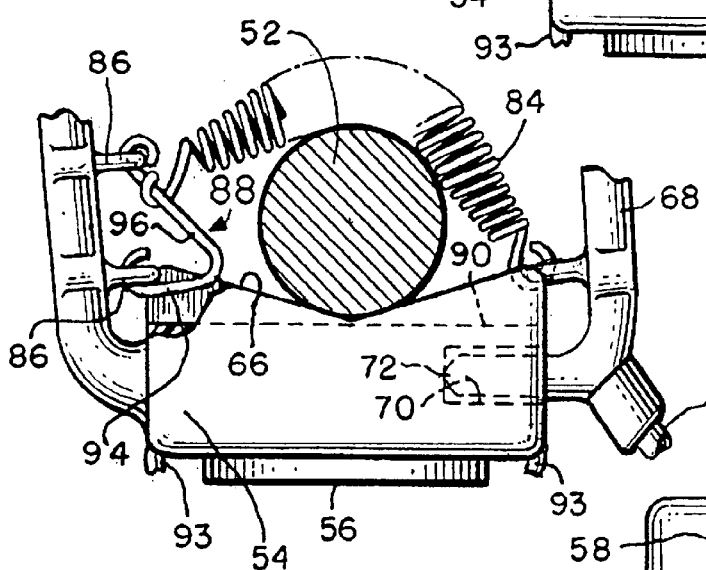
Figure 10:
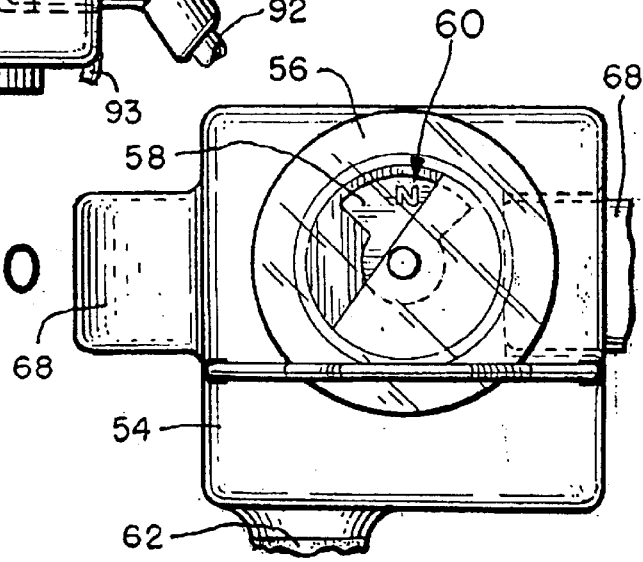
FIG. 10 is a front elevational view of the fault indicator of FIGS. 5–9.

As shown in FIGS. 9a–9c bridge member 88, which may be formed with a rigid wire, includes a first segment 94 projecting generally perpendicular to core member 78 at a first location, and a second segment 96, which extends from the end of the first segment to a second location on the core, preferably at a 45° angle to cable receiving surface 66.

As shown in FIGS. 9a–9c, for cables 52 of increasing diameter the end of spring 84 slides along portion 96 of bridge member 88, from its bottom end toward its top end, with the result that spring 84 accommodates cables of increasing diameters without exceeding its elastic modulous, while maintaining the cable in engagement with cable engaging surface 66.

It will be appreciated that while the clamp mechanism of the invention has been shown in conjunction with fault indicating devices, it may be used to advantage with other types of circuit condition monitoring devices, such as voltage indicators.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A clamping mechanism for mounting a circuit condition monitoring device on electrical cables having a predetermined range of diameters, comprising:

a housing for said monitoring device having a cable engaging surface;

a core member extending from said housing and adapted to encircle a cable, said core member having a first portion generally on one side of said cable and a second portion generally on the other side of said cable;

a bridge member having one end attached to said first portion of said core member at a first location, and its other end attached to said first portion of said core member at a second location between said first location and said housing;

biasing means attached at one end to said bridge member and attached at its other end to said second portion of said core member for biasing said cable into engagement with said cable engaging surface, said biasing means being attached to said bridge member by a sliding attachment allowing said one end of said biasing means to slide generally between said first location and said second location on said first portion of said core member;

said second portion of said core member including a gap between said attached biasing means and said housing for passing said cable into said core member between said biasing means and said cable engaging surface; and said one end of said biasing means sliding on said bridge member to accommodate said predetermined range of cable diameters.

2. A clamping mechanism as defined in claim 1 wherein said biasing means comprise a helical spring.

3. A clamping mechanism as defined in claim 1 wherein said core member comprises a plurality of parallel metallic strips.

4. A clamping mechanism as defined in claim 1 wherein said cable engaging surface comprises a channel axially aligned with said cable.

5. A clamping mechanism as defined in claim 1 wherein said bridge member provides a sliding engagement with said attached one end of said biasing means whereby said one end ramps on said bridge member from a position closer to said attached other end of said biasing means to a position further from said attached other end of said biasing means as it slides from said second location to said first location with cables of increasing diameter.

6. A clamping mechanism as defined in claim 5 wherein said bridge member comprises a rigid wire.

7. A clamping mechanism as defined in claim 6 wherein said biasing means comprise a helical spring.

8. A clamping mechanism as defined in claim 1 wherein said core member includes first, second and third contiguous segments, said first segment extending generally perpendicular to and on one side of said cable engaging surface on one side of said cable to an end, said second segment extending generally perpendicular to and on the other side of said cable engaging surface on the other side of said cable to an end, said third segment extending between said ends of said first and second segments, said bridge member being attached to said first segment and said other end of said biasing means being connected to said second segment.

9. A clamping mechanism as defined in claim 8 wherein said core member includes a fourth segment extending through said housing between the originating ends of said first and second segments, and said gap is located in said fourth segment.

10. A clamping mechanism as defined in claim 9 including a magnetic winding on said fourth segment within said housing.

11. A clamping mechanism as defined in claims 1 or 9 wherein said biasing means bias said gap closed.

12. A clamping mechanism as defined in claim 9 wherein said core member comprises a plurality of parallel metallic strips.

13. A clamping mechanism as defined in claim 9 wherein said bridging member is attached at said first end to said first core segment and at its other end to said fourth core segment.

14. A clamping mechanism as defined in claim 13 wherein said bridging member comprises a rigid wire extending between said first and second locations.

15. A clamping mechanism as defined in claim 14 wherein said one end of said biasing means slidably engages said wire.

16. A clamping mechanism for mounting a circuit condition monitoring device on electrical cables having a predetermined range of diameters, comprising:

a housing having a cable engaging surface;

a core member extending from said housing and adapted to encircle a cable, said core member including a first portion extending generally perpendicular to and on one side of said cable engaging surface, said first portion being integral with a second portion generally parallel to said cable engaging surface, said second porting being integral with a third portion generally parallel to said first portion and on the other side of said cable engaging surface, said third portion having an end movable relative to said housing providing a gap for passing said cable through to a position engaging said cable engaging surface;

a bridge member having a first end anchored at a first location on said first core portion, and a second end anchored at a second location between said first location and said housing; and means for biasing said cable into engagement with said cable engaging surface, said biasing means being slidably connected at one end to said bridge member and slidable thereon generally between said first and second locations to accommodate said predetermined range of cable diameters, the other end of said biasing means being connected to said movable end of said third core portion to bias said gap closed.

17. A clamping mechanism as defined in claim 16 wherein said biasing means comprise a helical spring.

18. A clamping mechanism as defined in claim 16 wherein said core member comprises a plurality of parallel metallic strips.

19. A clamping mechanism as defined in claim 16 wherein said cable engaging surface comprises a channel axially aligned with said cable.

20. A clamping mechanism as defined in claim 16 wherein said bridge member provides a sliding engagement with said attached one end of said biasing means whereby said one end ramps on said bridge member from a position closer to said attached other end of said biasing means to a position further from said attached other end of said biasing means as it slides from said second location to said first location with cables of increasing diameter.

21. A clamping mechanism as defined in claim 16 wherein said bridge member comprises a rigid wire.

22. A clamping mechanism as defined in claim 21 wherein said biasing means comprise a helical spring.

* * * * *